(12) United States Patent
Maezono et al.

(10) Patent No.: US 12,137,525 B2
(45) Date of Patent: Nov. 5, 2024

(54) FEEDER SETUP CHANGE METHOD AND COMPONENT MOUNTING DEVICE FOR SUPPORTING FEEDER SETUP CHANGE METHOD

(71) Applicant: Panasonic Intellectual Property Management Co., Ltd., Osaka (JP)

(72) Inventors: Hisashi Maezono, Fukuoka (JP); Hiroki Sagara, Fukuoka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 367 days.

(21) Appl. No.: 17/622,906

(22) PCT Filed: May 28, 2020

(86) PCT No.: PCT/JP2020/021202
§ 371 (c)(1),
(2) Date: Dec. 27, 2021

(87) PCT Pub. No.: WO2021/010033
PCT Pub. Date: Jan. 21, 2021

(65) Prior Publication Data
US 2022/0264778 A1   Aug. 18, 2022

(30) Foreign Application Priority Data
Jul. 18, 2019   (JP) .................. 2019-132426

(51) Int. Cl.
*H05K 13/04* (2006.01)
*G05B 19/418* (2006.01)
*H05K 13/02* (2006.01)

(52) U.S. Cl.
CPC ... *H05K 13/0409* (2018.08); *G05B 19/41865* (2013.01); *H05K 13/02* (2013.01);
(Continued)

(58) Field of Classification Search
CPC ............ G05B 19/418; G05B 19/41865; G05B 2219/50386; H05K 13/02; H05K 13/085
See application file for complete search history.

(56) References Cited

U.S. PATENT DOCUMENTS 6,275,744 B1 * 8/2001 Yoshida ............ H01L 21/67276
414/935
7,539,339 B2 * 5/2009 Tanabe ............... H05K 13/0413
382/146
(Continued)

FOREIGN PATENT DOCUMENTS

CN   104620187 A   5/2015
CN   108282992 A   7/2018
(Continued)

OTHER PUBLICATIONS

International Search Report of PCT application No. PCT/JP2020/021202 dated Sep. 1, 2020.
(Continued)

Primary Examiner — Nicholas Klicos
(74) Attorney, Agent, or Firm — PEARNE & GORDON LLP

(57) ABSTRACT

A setup change work support method includes a feeder information acquisition step, a production information acquisition step, and a target feeder determination step. The feeder information acquisition step acquires information on the capability of a feeder that can be disposed in a component supply unit of an electronic component mounting device for mounting an electronic component on a workpiece and that supplies the electronic component. The production information acquisition step acquires information on the production of the workpiece. The target feeder determination step determines a target feeder that is disposed in the component supply unit and is used to produce a target type
(Continued)

| FEEDER NUMBER | FEEDER TYPE | LOCATION | COMPONENT ATTACHMENT STATE | USE SCHEDULE | FEEDER CAPABILITY | | |
|---|---|---|---|---|---|---|---|
| | | | | | ACCURACY | SPEED | SUCCESS RATE |
| FT0802 | 8 mm TAPE | C42/L1/#1R | PR01(R214) | B112 | S | S | S |
| FT0803 | 8 mm TAPE | C73/PREPARATION AREA | PR02(R217) | - | A | A | S |
| FT0804 | 8 mm TAPE | STORAGE SHELF/S05 | PC01(R303) | - | S | S | S |
| FT0805 | 8 mm TAPE | STORAGE SHELF/S02 | - | - | B | A | B |
| FT0806 | 8 mm TAPE | C54/PREPARATION AREA | PC02(R555) | - | A | A | A |
| FT0807 | 8 mm TAPE | C48/L1/#3F | PR52(R314) | - | A | B | A |
| FT0808 | 8 mm TAPE | C73/PREPARATION AREA | PR07(R707) | - | A | A | A |
| FD005 | DOUBLE FEEDER | STORAGE SHELF/S11 | - | - | A | A | A |
| FS111 | TRIPLE STICK | C48/L1/#3F | PM55/PM09/PL06 | - | A | A | A |
| ... | ... | ... | ... | ... | ... | ... | ... |
| ↑ 69 | ↑ 70 | ↑ 71 | ↑ 72 | ↑ 73 | ↑ 74a | ↑ 74b | ↑ 74c |

74 based on information on the capability of the feeder and information on the production of the workpiece.

10 Claims, 15 Drawing Sheets

(52) U.S. Cl.
CPC .............. *G05B 2219/32264* (2013.01); *G05B 2219/50386* (2013.01)

(56) References Cited

U.S. PATENT DOCUMENTS

| | | | | |
|---|---|---|---|---|
| 2002/0042989 | A1* | 4/2002 | Kawase | H05K 13/0417 29/832 |
| 2012/0020765 | A1* | 1/2012 | Kuroda | H05K 13/085 414/749.1 |
| 2015/0248314 | A1* | 9/2015 | Morita | H05K 13/085 718/104 |
| 2016/0212897 | A1* | 7/2016 | Tsuge | H05K 13/089 |
| 2016/0231727 | A1 | 8/2016 | Sagara | |
| 2018/0192522 | A1* | 7/2018 | Taniguchi | H05K 13/0417 |
| 2020/0344926 | A1* | 10/2020 | Higashino | H05K 13/0417 |

FOREIGN PATENT DOCUMENTS

| | | |
|---|---|---|
| JP | 3-120897 | 5/1991 |
| JP | 2005-216965 | 8/2005 |
| JP | 2016-146381 | 8/2016 |
| JP | 2018-110188 | 7/2018 |
| WO | 2014/041640 | 3/2014 |

OTHER PUBLICATIONS

English Translation of Chinese Search Report dated May 30, 2024 for the related Chinese Patent Application No. 202080044794.5.

* cited by examiner

FIG. 8

| COMPONENT NAME | ELECTRICAL CHARACTERISTIC | COMPONENT SIZE | SUPPLY UNIT |
|---|---|---|---|
| PR01 | 500Ω | 0201 | 8 mm TAPE |
| PR02 | 10kΩ | 0402 | 8 mm TAPE |
| PC03 | 100pF | 1608 | 16 mm TAPE |
| PM08 | MICROCOMPUTER | 20 × 20 mm | STICK |
| ... | ... | ... | ... |
| ↑ | ↑ | ↑ | ↑ |
| 61 | 62 | 63 | 64 |

FIG. 9

| LINE NAME | SUPPLY POSITION | SLOT NUMBER | COMPONENT NAME | SUPPLY METHOD | FEEDER NUMBER |
|---|---|---|---|---|---|
| L2 | #1F | 1 | PR01 | TAPE | - |
| L2 | #1F | 2L | PR12 | DOUBLE FEEDER | - |
| L2 | #1F | 2R | PC01 | DOUBLE FEEDER | - |
| L2 | #1F | 3 | PM08 | STICK | - |
| L2 | #1F | 4 | PM01 | STICK | - |
| L2 | #1F | 5 | PL06 | STICK | - |
| L2 | #1F | 6 | PR02 | TAPE (SIMULTANEOUS) | - |
| L2 | #1F | 7 | PR52 | TAPE (SIMULTANEOUS) | - |
| L2 | #1F | 8 | PC22 | TAPE (SIMULTANEOUS) | - |
| L2 | #1F | 9 | PC66 | TAPE (SIMULTANEOUS) | - |
| ... | ... | ... | ... | ... | ... |
| ↑ | ↑ | ↑ | ↑ | ↑ | ↑ |
| 65 | 66 | 67 | 61 | 68 | 69 |

FIG. 10

| FEEDER NUMBER | FEEDER TYPE | LOCATION | COMPONENT ATTACHMENT STATE | USE SCHEDULE | FEEDER CAPABILITY | | |
|---|---|---|---|---|---|---|---|
| | | | | | ACCURACY | SPEED | SUCCESS RATE |
| FT0802 | 8 mm TAPE | C42/L1/#1R | PR01(R214) | B112 | S | S | S |
| FT0803 | 8 mm TAPE | C73/PREPARATION AREA | PR02(R217) | - | A | A | S |
| FT0804 | 8 mm TAPE | STORAGE SHELF/S05 | PC01(R303) | - | S | S | S |
| FT0805 | 8 mm TAPE | STORAGE SHELF/S02 | - | - | B | A | B |
| FT0806 | 8 mm TAPE | C54/PREPARATION AREA | PC02(R555) | - | A | A | A |
| FT0807 | 8 mm TAPE | C48/L1/#3F | PR52(R314) | - | A | B | A |
| FT0808 | 8 mm TAPE | C73/PREPARATION AREA | PR07(R707) | - | A | A | A |
| FD005 | DOUBLE FEEDER | STORAGE SHELF/S11 | - | - | A | A | A |
| FS111 | TRIPLE STICK | C48/L1/#3F | PM55/PM09/PL06 | - | A | A | A |
| ... | ... | ... | ... | ... | ... | ... | ... |
| ↑ | ↑ | ↑ | ↑ | ↑ | ↑ | ↑ | ↑ |
| 69 | 70 | 71 | 72 | 73 | 74a | 74b | 74c |

FIG. 11

| COMPONENT NAME | REEL NUMBER | FEEDER NUMBER | SHELF NUMBER |
|---|---|---|---|
| PR01 | R214 | FT0802 | - |
| PR01 | R801 | - | S03 |
| PR02 | R217 | FT0803 | - |
| PR12 | R143 | - | S03 |
| PR52 | R314 | FT0807 | - |
| PC01 | R303 | FT0804 | - |
| PC02 | R555 | FT0806 | - |
| PC22 | R222 | - | S03 |
| PC66 | R662 | - | S03 |
| PL06 | - | FS111 | - |
| PM01 | - | - | S04 |
| PM08 | - | - | S04 |
| ... | ... | ... | ... |//
↑ 61  ↑ 75  ↑ 69  ↑ 76

FIG. 12

| SLOT NUMBER | COMPONENT NAME | SUPPLY METHOD | FEEDER NUMBER | REEL NUMBER |
|---|---|---|---|---|
| 1 | PR01 | TAPE | FT0804 | R801 |
| 2L | PR12 | DOUBLE FEEDER | FD005 | R143 |
| 2R | PC01 | DOUBLE FEEDER | FD005 | R303 |
| 3 | PM08 | STICK | FS111 | (S04) |
| 4 | PM01 | STICK | FS111 | (S04) |
| 5 | PL06 | STICK | FS111 | (←) |
| 6 | PR02 | TAPE (SIMULTANEOUS) | FT0803 | R217 |
| 7 | PR52 | TAPE (SIMULTANEOUS) | FT0807 | R314 |
| 8 | PC22 | TAPE (SIMULTANEOUS) | FT0806 | R222 |
| 9 | PC66 | TAPE (SIMULTANEOUS) | FT0808 | R662 |
| ... | ... | ... | ... | ... |
| ↑ 67 | ↑ 61 | ↑ 68 | ↑ 69 | ↑ 75 |

FEEDER SETUP CHANGE METHOD AND COMPONENT MOUNTING DEVICE FOR SUPPORTING FEEDER SETUP CHANGE METHOD

CROSS-REFERENCE TO RELATED APPLICATIONS

This application is a U.S. national stage application of the PCT International Application No. PCT/JP2020/021202 filed on May 28, 2020, which claims the benefit of foreign priority of Japanese patent application No. 2019-132426 filed on Jul. 18, 2019, the contents all of which are incorporated herein by reference.

TECHNICAL FIELD

The present disclosure relates to a setup change work support method and a setup change work support device that support a setup change of a feeder disposed in a component supply unit of an electronic component mounting device.

BACKGROUND ART

An electronic component mounting device manufactures a mounting substrate by mounting a plurality of types of electronic components on a substrate (workpiece). The plurality of types of electronic components mounted on the substrate are supplied from a plurality of feeders disposed on a carriage mounted on a component supply unit of the electronic component mounting device. When the type of the mounting substrate manufactured by the electronic component mounting device is changed, a setup change (external setup) is executed in which a plurality of feeders to which electronic components are attached are replaced with spare carriages disposed in advance so as to correspond to the manufacture of the type after the change, instead of the carriages mounted on the electronic component mounting device. In addition, the setup change (internal setup) for replacing the feeders disposed on the carriages mounted on the electronic component mounting device is also executed.

Since such a setup change is complicated work, a method of instructing and supporting a worker to perform the setup change work has been proposed (see, for example, PTL 1). In the method described in PTL 1, work of removing a feeder from a carriage, work of moving an electronic component attached to the feeder to a vacant position in the carriage, work of disposing the feeder in a state where the electronic component is attached thereto on the carriage, and work of newly attaching the electronic component to the feeder and disposing the feeder on the carriage are arranged and displayed in the order to be executed, thereby supporting setup change work of a worker.

CITATION LIST

Patent Literature

PTL 1: Unexamined Japanese Patent Publication No. 2016-146381

SUMMARY OF THE INVENTION

A setup change work support method of the present disclosure includes a feeder information acquisition step, a production information acquisition step, and a target feeder determination step.

The feeder information acquisition step acquires information on the capability of each of feeders, the feeders each being disposable in a component supply unit of an electronic component mounting device and supplying electronic components to the component supply unit, the electronic component mounting device mounting the electronic components on workpieces.

The production information acquisition step acquires information on the production of each of workpiece types of the workpieces.

The target feeder determination step determines, among the feeders, a target feeder to be that is disposed in the component supply unit and is used to produce a target workpiece type among the workpiece types, in accordance with information on the capability of each of the feeders and information on the production of each of the workpiece types.

The setup change work support device of the present disclosure includes a feeder information acquisition unit, a production information acquisition unit, and a target feeder determination unit.

The feeder information acquisition unit acquires information on the capability of each of feeders, the feeders each being disposable in a component supply unit of an electronic component mounting device and supplying electronic components to the component supply unit, the electronic component mounting device mounting the electronic components on workpieces.

The production information acquisition unit acquires information on the production of each of workpiece type of the workpieces.

The target feeder determination unit determines, among the feeders, a target feeder to be that is disposed in the component supply unit and is used to produce a target workpiece type among the workpiece types, in accordance with information on the capability of each of the feeders and information on the production of each of the workpiece types.

BRIEF DESCRIPTION OF DRAWINGS

FIG. 8 is an explanatory diagram of an example of component information used in the management computer (setup change work support device) of the exemplary embodiment.

FIG. 9 is an explanatory diagram of an example of component arrangement information used in the management computer (setup change work support device) of the exemplary embodiment.

FIG. 10 is an explanatory diagram of an example of feeder information used in the management computer (setup change work support device) of the exemplary embodiment.

FIG. 11 is an explanatory diagram of an example of component location information used in the management computer (setup change work support device) of the exemplary embodiment.

FIG. 12 is an explanatory diagram of an example of setup change component arrangement information created by the management computer (setup change work support device) of the exemplary embodiment.

DESCRIPTION OF EMBODIMENT

Even in a feeder capable of supplying the same electronic component, there is a difference in accuracy of a supply position of the electronic component and capability of the feeder such as a supply speed in different model numbers, and it is necessary to select an appropriate feeder in consideration of required mounting accuracy, mounting efficiency, and the like. In addition, even with the same model number, there may be a difference in the capability of the feeder depending on the degree of wear of the component.

In the prior art including PTL 1, a feeder in a state where an electronic component is attached can be specifically instructed including a current location. However, selection of a feeder for newly attaching an electronic component has been left to a worker. Therefore, there is a case where a feeder having appropriate mounting accuracy and mounting efficiency is not used, and there is room for further improvement in order to execute the setup change work while selecting an appropriate feeder in consideration of the production efficiency and quality of the mounting substrate.

Figure 3:
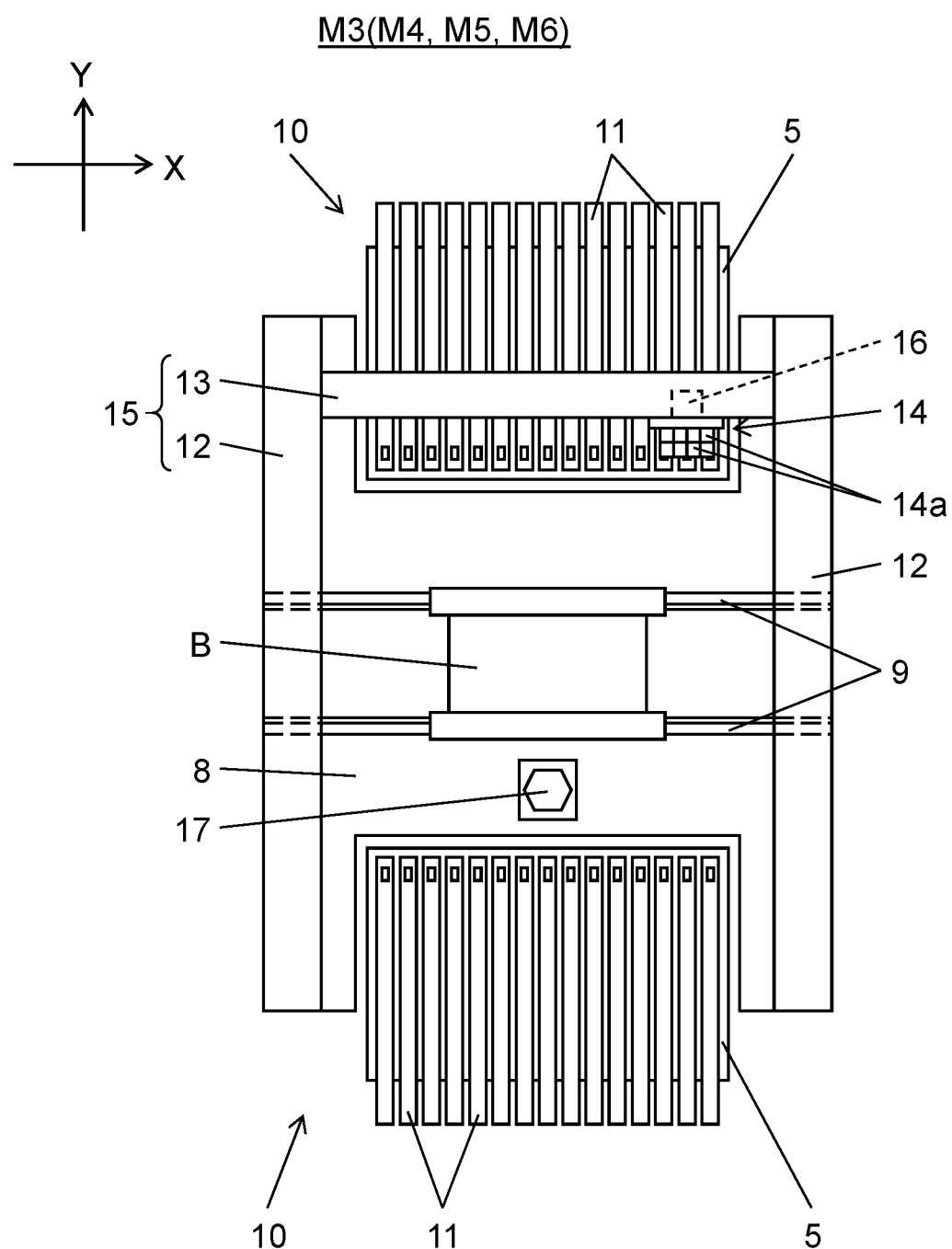
FIG. 3 is a plan view of an electronic component mounting device included in the component mounting system of the exemplary embodiment.
Figure 4:
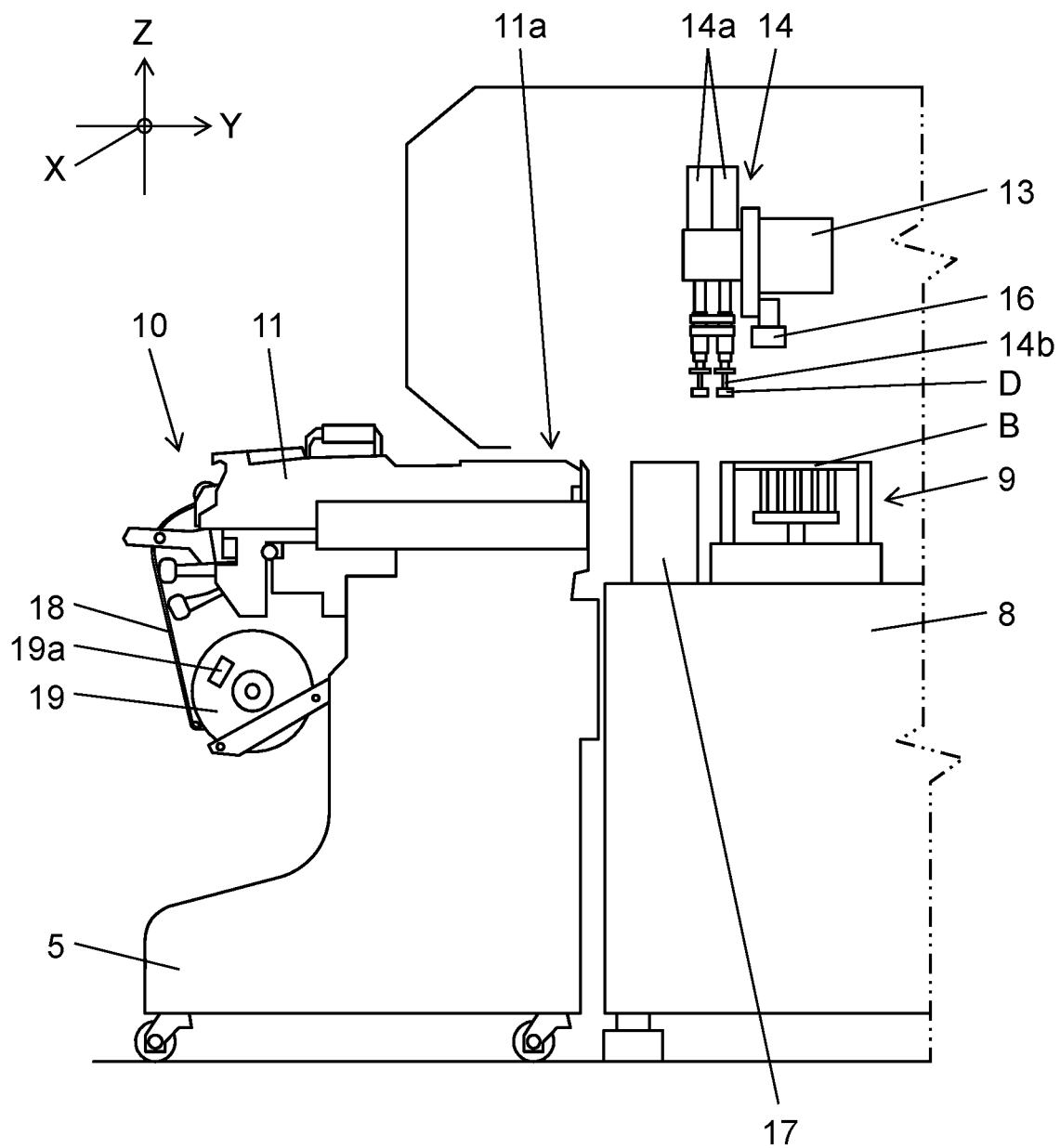
FIG. 4 is a partial cross-sectional view of the electronic component mounting device included in the component mounting system of the exemplary embodiment.

Hereinafter, an exemplary embodiment of the present disclosure will be described in detail with reference to the drawings. The configurations, shapes, and the like described below are examples for description, and can be appropriately changed according to specifications of a component mounting system, a component mounting line, an electronic component mounting device, a management computer (setup change work support device), and the like. Hereinafter, in all the drawings, components corresponding to each other are denoted by an identical reference mark, and duplicative description thereof will be omitted. In FIG. 3 and a part of the following description, an X direction (left and right direction in FIG. 3) in a substrate conveyance direction and a Y direction (vertical direction in FIG. 3) orthogonal to the substrate conveyance direction are illustrated as two axial directions orthogonal to each other in a horizontal plane. In FIG. 4, a Z direction (vertical direction in FIG. 4) is illustrated as a height direction orthogonal to a horizontal plane. The Z direction is a vertical direction or an orthogonal direction when the electronic component mounting device is installed on the horizontal plane.

First, a configuration of component mounting system 1 will be described with reference to FIG. 1. Component mounting system 1 is configured such that three component mounting lines L1 to L3 arranged on floor F are connected by wired or wireless communication network 2 and managed by management computer 3. Component mounting lines L1 to L3 are arranged in production area Ap provided on floor F. Component mounting lines L1 to L3 are configured by connecting a plurality of production facilities including a screen printing device and an electronic component mounting device as described later, and have a function of producing a mounting substrate (product) in which an electronic component (hereinafter, it is simply referred to as "component D") is mounted on a substrate. Note that the number of component mounting lines L1 to L3 included in component mounting system 1 does not need to be three, and may be one, two, or four or more.

Figure 1:
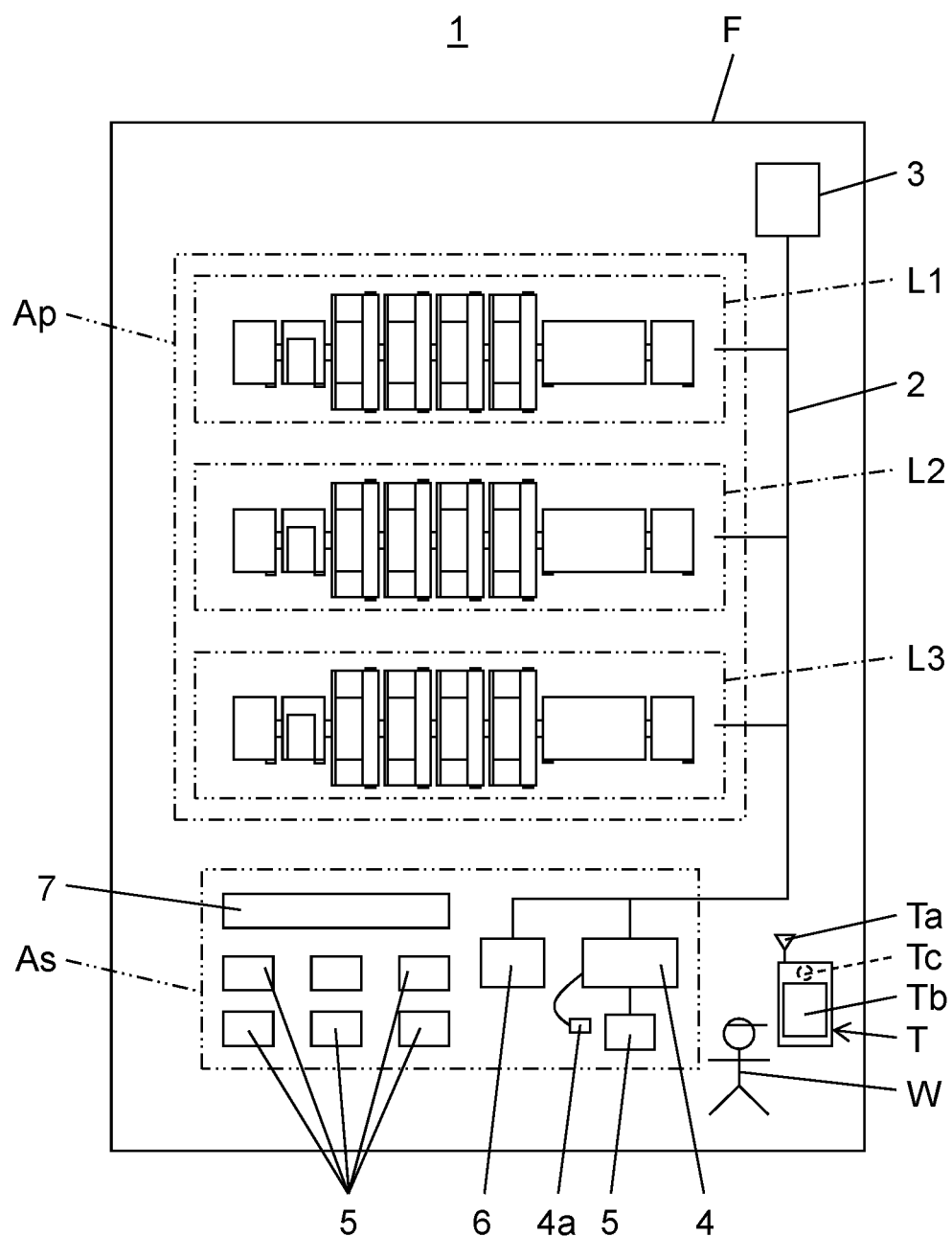
FIG. 1 is a configuration explanatory diagram of a component mounting system of an exemplary embodiment.

In FIG. 1, arrangement work support device 4 is disposed in preparation area As different from production area Ap provided on floor F. Arrangement work support device 4 is connected to management computer 3 via communication network 2. Arrangement work support device 4 includes reader 4a that reads label 19a (see FIG. 4) on which a bar code, a two-dimensional code, and the like attached to reel 19 storing carrier tape 18 in a wound state are displayed. Replacement carriage 5 to be subjected to arrangement work described later is connected to arrangement work support device 4. In preparation area As, a plurality of carriages 5 in various states such as before, during, or after the arrangement work is executed are stored.

Feeder maintenance device 6 connected to management computer 3 via communication network 2 is disposed in preparation area As. Feeder maintenance device 6 executes maintenance such as state measurement of attached tape feeders 11 (see FIG. 3) and adjustment of a feeding stop position. A maintenance result of tape feeders 11 by feeder maintenance device 6 is transmitted to management computer 3.

In preparation area As, storage shelf 7 for storing detachable members such as a plurality of screen masks shared by production facilities disposed on floor F, tape feeders 11, mounting head 14, suction nozzle 14b, and reel 19 (see FIG. 4) is disposed. Note that the number of arrangement work support device 4 and feeder maintenance device 6 disposed in preparation area As is not necessarily one, and may be two or more. In addition, the number of storage shelves 7 disposed in preparation area As does not need to be one, and may be two or more.

In FIG. 1, the arrangement work (external setup work) according to the work instruction corresponding to the type of the mounting substrate to be produced in component mounting lines L1 to L3 is performed on carriage 5 connected to arrangement work support device 4. As the arrangement work, worker W performs work of removing tape feeder 11, reel 19, and the like that supply instructed component D from carriage 5, work of removing carrier tape 18 from tape feeder 11, work of attaching carrier tape 18 stored in reel 19 to tape feeder 11, work of attaching tape feeder 11 to an instructed position of carriage 5, and the like.

Further, worker W performs work of conveying to storage shelf 7 and storing removed tape feeder 11 and reel 19, and work of picking up tape feeder 11 and reel 19 attached to carriage 5 from storage shelf 7 and conveying them to carriage 5. Note that attachment and detachment of carrier tape 18 (reel 19) to and from tape feeder 11 by worker W may be performed by an attachment and detachment robot (not illustrated) including a parallel link or an articulated mechanism. In addition, attachment and detachment of tape feeder 11 and reel 19 to and from carriage 5, and conveyance of tape feeder 11 and reel 19 between carriage 5 and storage shelf 7 may be executed by an automatic conveyance robot (not illustrated) including an articulated mechanism and the like.

In FIG. 1, worker W carries mobile terminal T used for work. Mobile terminal T includes terminal-side communication unit Ta that wirelessly communicates with arrangement work support device 4 or management computer 3 to exchange information, and touch panel Tb having a display function and an input function. Furthermore, mobile terminal T includes camera Tc on a surface opposite to touch panel Tb. Mobile terminal T performs display processing on various types of information received from arrangement work support device 4, and displays the information on touch panel Tb. Furthermore, mobile terminal T recognizes information of label 19a captured by camera Tc. In addition, mobile terminal T transmits various information input from touch panel Tb, information of recognized label 19a, and the like to arrangement work support device 4 or management computer 3.

In FIG. 1, when tape feeder 11 is attached to carriage 5 connected to arrangement work support device 4, electric power is supplied from arrangement work support device 4 to tape feeder 11 via carriage 5, and a feeder controller (not illustrated) incorporated in tape feeder 11 is in a state of being able to communicate with arrangement work support device 4. Carriage 5 is provided with a plurality of slots for mounting tape feeder 11. Arrangement work support device 4 acquires information (feeder number) specifying tape feeder 11 from the feeder controller of tape feeder 11 mounted in the slots. In addition, arrangement work support device 4 acquires, from carriage 5, information (carriage number) for specifying carriage 5 and information (slot number) for specifying the slots in which tape feeder 11 is mounted.

In the work of attaching carrier tape 18 to tape feeder 11 in the arrangement work, worker W reads label 19a attached to reel 19 by reader 4a, and collates an acquired reel number with information stored in arrangement work support device 4 or management computer 3. In addition, when reel 19 is stored in storage shelf 7 or when reel 19 is taken out from storage shelf 7, worker W reads label 19a of reel 19 using mobile terminal T and checks the label. As a result, the attachment status of tape feeder 11 to carriage 5, the attachment status of reel 19 to tape feeder 11, and the like can be acquired.

In FIG. 1, in carriages 5 in preparation area As including carriage 5 connected to arrangement work support device 4, the arrangement work can be executed in parallel with the production of the mounting substrate in component mounting lines L1 to L3. Hereinafter, the setup change work for changing the type outside component mounting lines L1 to L3 including the arrangement work on carriage 5 is referred to as external setup work.

When changing the type of the mounting substrate to be produced in component mounting lines L1 to L3, worker W moves carriage 5, on which the arrangement work has been completed in preparation area As, to component mounting lines L1 to L3, and executes the setup change work of replacing carriage 5 with carriage 5 mounted on the electronic component mounting device. In the setup change work, worker W conveys the replacement screen masks, tape feeder 11, mounting head 14, suction nozzle 14b, reel 19, and the like stored in preparation area As to component mounting lines L1 to L3 to replace them. Hereinafter, the setup change work for a type change in component mounting lines L1 to L3 including the setup change work for replacing carriage 5 is referred to as internal setup work.

Figure 2:
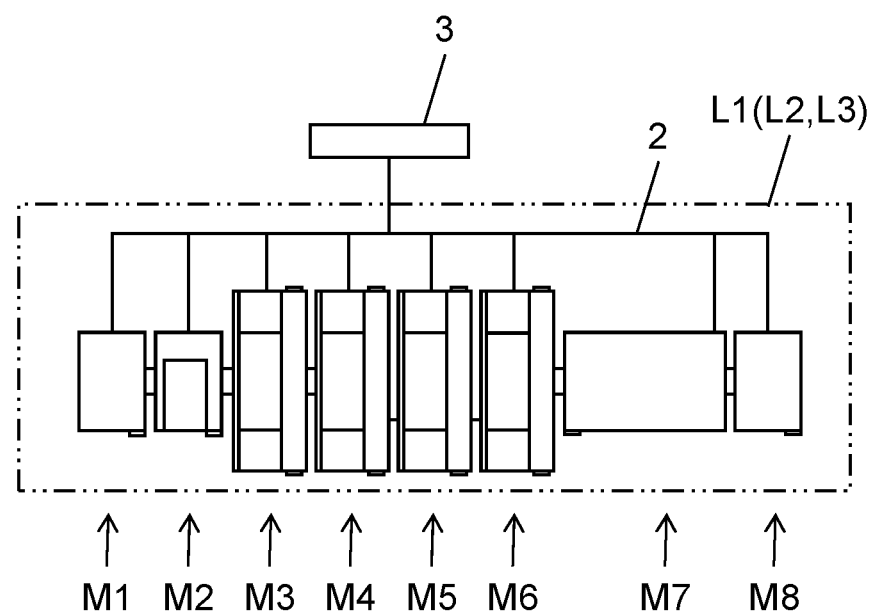
FIG. 2 is a configuration explanatory diagram of a component mounting line included in the component mounting system of the exemplary embodiment.

Next, a detailed configuration of component mounting lines L1 to L3 will be described with reference to FIG. 2. Component mounting lines L1 to L3 have the same configuration, and component mounting line L1 will be described below. Component mounting line L1 is configured by connecting production facilities such as substrate supply device M1, screen printing device M2, electronic component mounting devices M3 to M6, reflow device M7, and substrate recovery device M8 in series from an upstream side (a left side in a plane of the drawing) to a downstream side (a right side in the plane of the drawing) in the substrate conveyance direction. Note that component mounting line L1 may be a group of production facilities connected via communication network 2, and the production facilities may not be physically connected to each other.

Substrate supply device M1, screen printing device M2, electronic component mounting devices M3 to M6, reflow device M7, and substrate recovery device M8 are connected to management computer 3 via communication network 2. Substrate supply device M1 includes a storage unit such as a rack that stores a plurality of substrates, and executes a substrate supply operation of supplying a substrate taken out from the storage unit to a downstream device. Screen printing device M2 executes a solder printing operation of printing solder on a substrate carried in from the upstream side via a screen mask attached to the printing operation unit.

Electronic component mounting devices M3 to M6 execute component mounting work of mounting component D by mounting head 14 on the substrate on which solder is printed. Note that, in component mounting line L1, the number of electronic component mounting devices M3 to M6 is not limited to four, and the number of electronic component mounting devices M3 to M6 may be one to three or five or more. Reflow device M7 heats the substrate carried into the device by a substrate heating unit, and executes a substrate heating operation of solder-bonding an electrode portion of the substrate and component D. Substrate recovery device M8 includes a storage unit such as a rack that stores a plurality of substrates, and executes a substrate recovery operation of receiving a substrate carried out by an upstream device and recovering the substrate to the storage unit.

Next, a configuration of electronic component mounting devices M3 to M6 will be described with reference to FIGS. 3 and 4. Since electronic component mounting devices M3 to M6 have the same configuration, electronic component mounting device M3 will be described. Electronic component mounting device M3 has a function of mounting component D on substrate B. In FIG. 3, substrate conveyance mechanism 9 is installed at the center of base 8 in an X direction. Substrate conveyance mechanism 9 conveys substrate B carried in from an upstream side along the X direction, and positions and holds substrate B at a mounting operation position using mounting head 14 described below. Furthermore, substrate conveyance mechanism 9 conveys substrate B on which the component mounting operation has been completed to a downstream side. Component supply units 10 are installed on both sides of substrate conveyance mechanism 9.

In FIGS. 3 and 4, carriage 5 on which a plurality of tape feeders 11 (feeders) are mounted in parallel in the X direction is attached to component supply unit 10. Tape feeder 11 supplies component D to component supply position 11a where mounting head 14 takes out component D by pitch-feeding carrier tape 18 having pockets for storing component D in a direction (tape feeding direction) from an outside of component supply unit 10 toward substrate conveyance mechanism 9.

That is, tape feeder 11 can be disposed in component supply unit 10 of electronic component mounting devices M3 to M6 that mount component D (electronic component) on substrate B (workpiece), and is a feeder that supplies component D. A plurality of types of tape feeders 11 are prepared according to the width (8 mm, 16 mm, etc.) of mountable carrier tape 18, the component size (1608, 0402, etc.) of suppliable component D, the type (chip parts, deformed parts, etc.), and the like. Note that the feeder mounted on carriage 5 may be a tray feeder that supplies component D placed on a tray, a stick feeder that supplies component D aligned and held on a hollow stick, or the like, in addition to tape feeder 11.

In FIG. 3, Y-axis tables 12 including a linear drive mechanism are disposed at both ends in the X direction on an upper surface of base 8. Similarly, beam 13 including a linear mechanism is coupled to Y-axis tables 12 so as to be movable in the Y direction. Mounting head 14 is attached to beam 13 so as to be movable in the X direction. Mounting head 14 includes a plurality of (here, eight) nozzle units 14a. A plurality of types of mounting heads 14 having different numbers of nozzle units 14a are prepared.

In FIG. 4, suction nozzle 14b that holds component D by vacuum suction is attached to a lower end portion of each nozzle unit 14a. As suction nozzle 14b, a plurality of types having different nozzle shapes and the like are prepared according to the size, shape, and the like of component D to be sucked. Each nozzle unit 14a moves up and down suction nozzle 14b in the vertical direction (Z direction).

In FIG. 3, Y-axis tables 12 and beam 13 constitute mounting head moving mechanism 15 that moves mounting head 14 in the horizontal direction (X direction, Y direction). Mounting head moving mechanism 15 and mounting head 14 cause suction nozzle 14b to suck and pick up component D from component supply position 11a of tape feeder 11 attached to component supply unit 10. Then, mounting head moving mechanism 15 executes a component mounting operation of repeating a series of mounting turns for transferring and mounting head 14 to a mounting position of substrate B held by substrate conveyance mechanism 9.

In FIGS. 3 and 4, head camera 16 that is positioned on a lower surface side of beam 13 and moves integrally with mounting head 14 is attached to beam 13. Head camera 16 is moved above substrate B positioned at the mounting operation position of substrate conveyance mechanism 9 by movement of mounting head 14, and images a substrate mark (not illustrated) provided on substrate B to recognize a position of substrate B.

Component recognition camera 17 is installed between component supply unit 10 and substrate conveyance mechanism 9. When mounting head 14 taking out component D from component supply unit 10 moves upward, component recognition camera 17 images component D held by suction nozzle 14b and recognizes a holding position and the like. In the component mounting operation for mounting component D on substrate B by mounting head 14, the mounting position is corrected in consideration of a recognition result of substrate B obtained by head camera 16 and a recognition result of component D obtained by component recognition camera 17.

In FIG. 4, reel 19 around which carrier tape 18 for storing component D is wound is held on a front side of carriage 5. Tape feeder 11 conveys carrier tape 18 stored in reel 19 in the tape feeding direction, and supplies component D to a component takeout position by mounting head 14. Label 19a is attached to reel 19.

Figure 5:
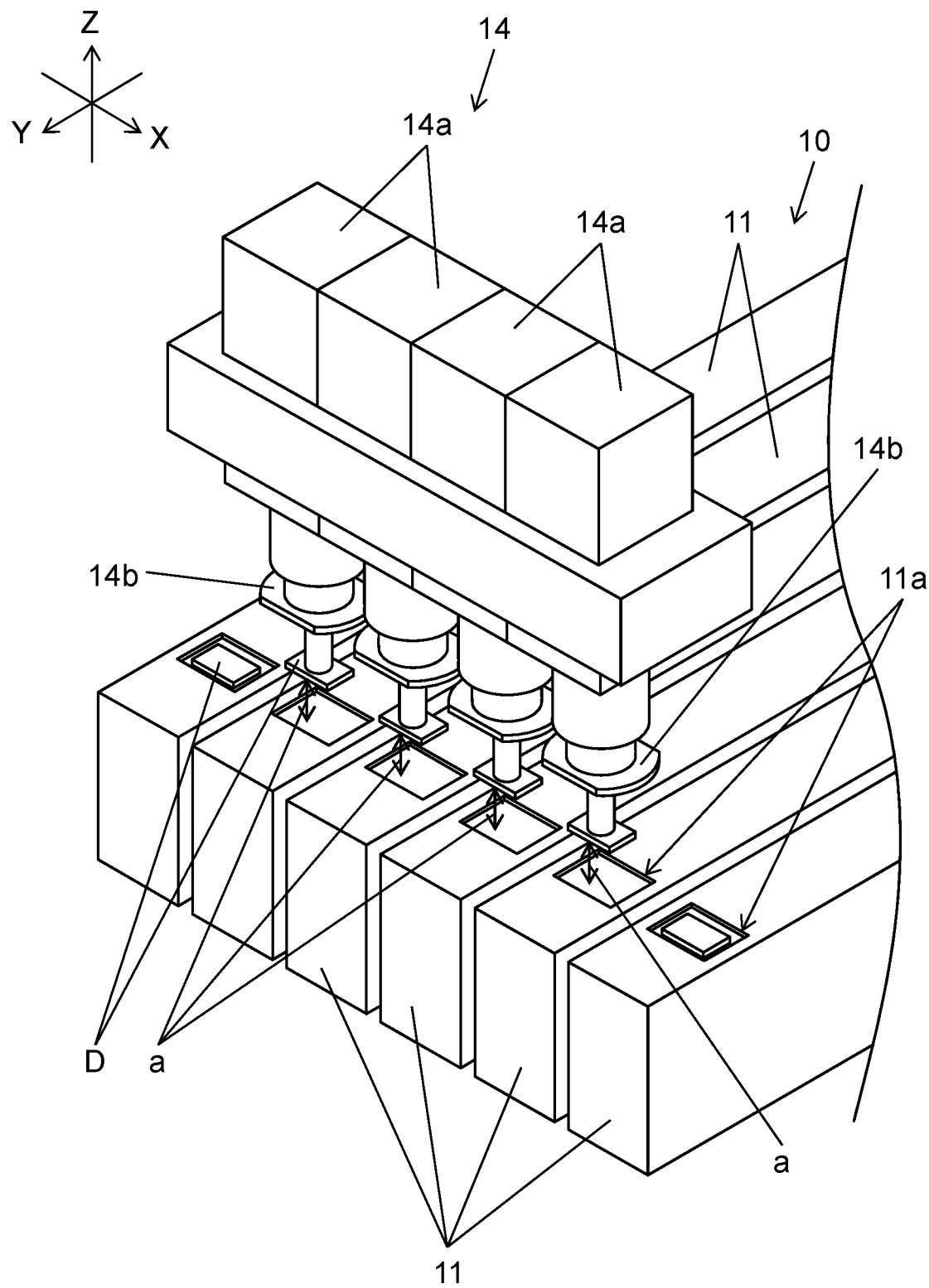
FIG. 5 is an explanatory diagram illustrating simultaneous suction of a plurality of electronic components by a plurality of suction nozzles in the electronic component mounting device included in the component mounting system of the exemplary embodiment.

Next, simultaneous suction of component D by the plurality of suction nozzles 14b included in mounting head 14 will be described with reference to FIG. 5. FIG. 5 illustrates four nozzle units 14a arranged in the direction (X direction) in which tape feeders 11 are arranged, among eight nozzle units 14a included in mounting head 14. Tape feeder 11 and nozzle unit 14a are installed at the same interval, and component D is supplied to each component supply position 11a. By simultaneously raising and lowering four suction nozzles 14b in this state (arrow a), four components D supplied to component supply position 11a can be simultaneously sucked.

Next, double feeder 20 (feeder) mounted on carriage 5 will be described with reference to FIG. 6A. Double feeder 20 incorporates two sets of tape conveyance mechanisms for conveying carrier tape 18. On back surface 20a of double feeder 20, insertion port 20b into which carrier tape 18A stored in reel 19A is inserted, and insertion port 20c into which carrier tape 18B stored in reel 19B is inserted are formed. On upper surface 20d of double feeder 20, two component supply positions 20e, 20f are formed. Two sets of tape conveyance mechanisms convey two carrier tapes 18A, 18B independently. As a result, component D stored in carrier tape 18A is supplied to component supply position 20e, and component D stored in carrier tape 18B is supplied to component supply position 20f.

Next, triple stick feeder 21 (feeder) attached to carriage 5 will be described with reference to FIG. 6B. Triple stick feeder 21 includes three sets of component conveyance mechanisms 21d, 21e, 21f that receive components D stored in stick cases 22A, 22B, 22C, respectively, and convey and supply components D to component supply positions 21a, 21b, 21c, respectively. Component conveyance mechanism 21d independently supplies component D stored in stick case 22A to component supply position 21a, component conveyance mechanism 21e independently supplies component D stored in stick case 22B to component supply position 21b, and component conveyance mechanism 21f independently supplies component D stored in stick case 22C to component supply position 21c.

Figure 6A:
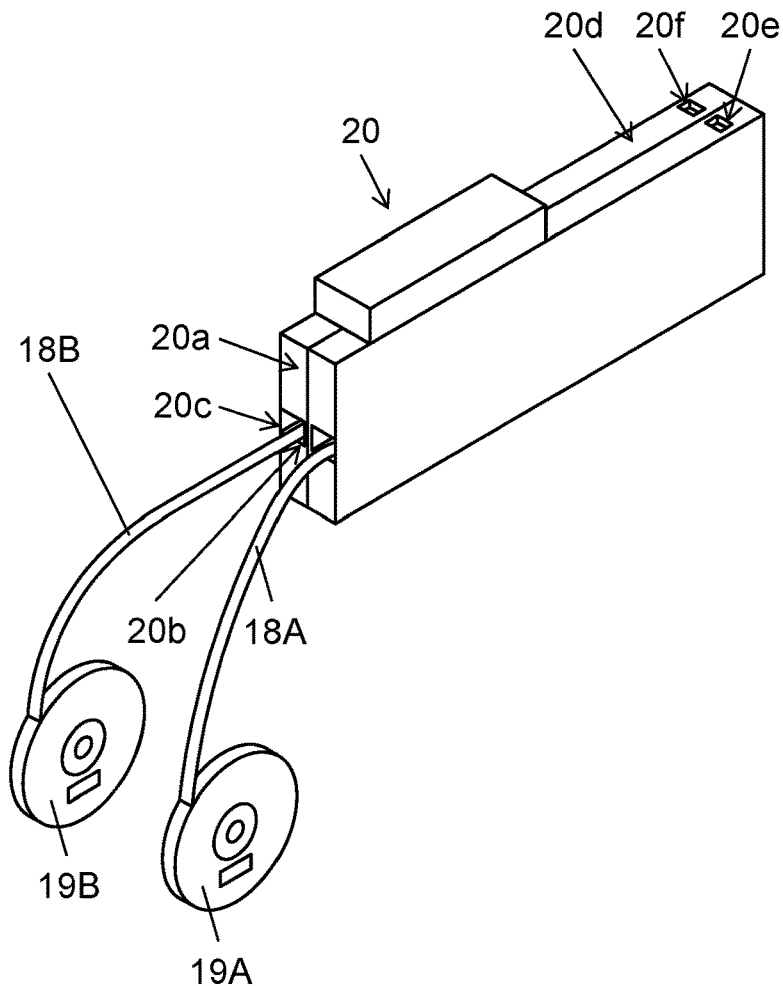
FIG. 6A is a configuration explanatory diagram of a double feeder used in the electronic component mounting device included in the component mounting system of the exemplary embodiment.
Figure 6B:
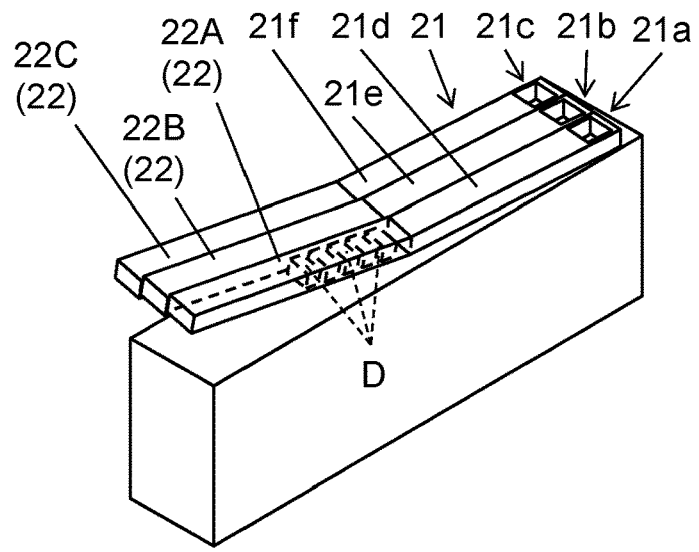
FIG. 6B is a configuration explanatory diagram of a triple stick feeder used in the electronic component mounting device included in the component mounting system of the exemplary embodiment.

In FIGS. 6A and 6B, components D supplied from double feeder 20 to two component supply positions 20e, 20f may be the same or different. Furthermore, components D supplied from triple stick feeder 21 to three component supply positions 21a, 21b, 21c may be the same or different. As described above, double feeder 20 and triple stick feeder 21 are multi-feeders capable of supplying a plurality of types of components D (electronic components).

Next, a configuration of management computer 3 will be described with reference to FIG. 7. Here, among the functions of management computer 3, a configuration related to a function of supporting a setup change of electronic component mounting devices M3 to M6 will be described. Management computer 3 includes input unit 32 and display unit 33 in addition to processing unit 30 and storage unit 31 as a storage device. Processing unit 30 is a data processing device such as a central processing unit (CPU), and includes feeder information acquisition unit 34, component location information acquisition unit 35, production information acquisition unit 36, production history acquisition unit 37, maintenance information acquisition unit 38, feeder evaluation unit 39, target feeder determination unit 40, and pickup instruction unit 41 as internal processing units.

Storage unit 31 stores production plan information 42, type information 43, component information 44, component arrangement information 45, feeder information 46, component location information 47, production information 48, production history information 49, maintenance information 50, setup change component arrangement information 51, and the like. Input unit 32 is an input device such as a keyboard, a touch panel, or a mouse, and is used when an operation command or data is input. Display unit 33 is a display device such as a liquid crystal panel, and displays various types of information such as an operation screen for operation by input unit 32 in addition to displaying various types of data stored in storage unit 31. Note that management computer 3 does not need to be configured by one computer, and may be configured by a plurality of devices. For example, all or some of the storage devices may be provided in the cloud via a server.

Figure 7:
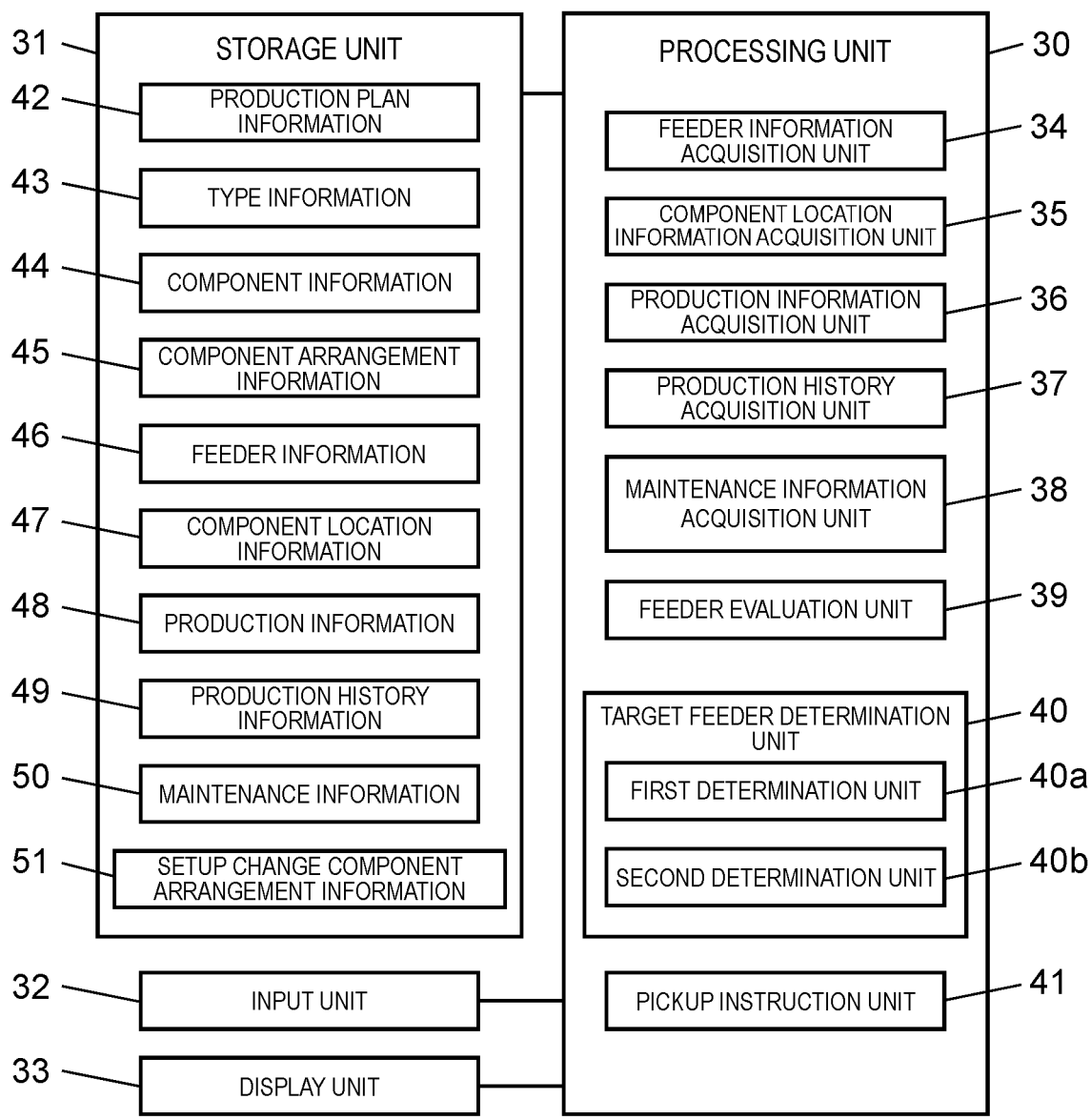
FIG. 7 is a block diagram illustrating a configuration of a management computer (setup change work support device) of the exemplary embodiment.

In FIG. 7, production plan information 42 stores a production plan including information specifying the number of production sheets, scheduled production date and time, and component mounting lines L1 to L3 for producing the mounting substrate for each type of the mounting substrate to be produced. Type information 43 stores information necessary for component mounting work, such as a component name and the mounting position of component D (electronic component) mounted on substrate B, for each type of the mounting substrate. Component information 44 stores, for each component name of component D, electrical characteristics, a component size, information on a supply means (information such as the width of the carrier tape in addition to supply means such as carrier tape 18, stick case 22, and the tray), and the like. In component arrangement information 45, arrangement information of components D in electronic component mounting devices M3 to M6 is stored for each type of mounting substrate.

Here, an example of component information 44 will be described with reference to FIG. 8. Component information 44 includes component name 61, electrical characteristic 62, component size 63, and supply unit 64. Component name 61 is information for specifying component D. Electrical characteristic 62 stores a type (function) of component D such as a microcomputer and a memory in addition to electrical characteristics such as resistance and capacitance of component D. Component size 63 stores a size (0201 or the like) of a chip component, and a size (20 mm×20 mm or the like) of a quad flat package (QFP) component. Supply unit 64 stores a tape width (8 mm, 16 mm, or the like) in the case of carrier tape 18 in addition to a method (carrier tape 18, stick case 22, and the like) of storing component D.

Next, an example of component arrangement information 45 will be described with reference to FIG. 9. Component arrangement information 45 stores an arrangement of components D created in advance on the basis of type information 43 and the like. Component arrangement information 45 includes line name 65, supply position 66, slot number 67, component name 61, supply method 68, and feeder number 69. Line name 65 is information for specifying component mounting lines L1 to L3, and "L2" indicates component mounting line L2. Supply position 66 is information for specifying the positions (front side or rear side) of electronic component mounting devices M3 to M6 and component supply unit 10, and "#1F" indicates component supply unit 10 on a front side of electronic component mounting device M3(#1). Slot number 67 indicates the position of the slot of carriage 5 to which tape feeder 11 and the like are mounted.

Component name 61 is information for specifying component D supplied from the position, and is the same as component name 61 of component information 44. That is, component arrangement information 45 is associated with component information 44 via component name 61. Supply method 68 indicates a type of the feeder disposed at the position, where "tape" indicates tape feeder 11, "double feeder" indicates double feeder 20, and "stick" indicates stick feeder (triple stick feeder 21). Furthermore, "tape (simultaneous)" indicates tape feeder 11 that is a target of simultaneous suction. Feeder number 69 indicates information for specifying the feeder mounted at the position. In FIG. 9, since the target feeder is not yet allocated, all feeder numbers 69 are blank.

In FIG. 7, feeder information acquisition unit 34 acquires information on the status of the feeder that supplies component D (electronic component) from electronic component mounting devices M3 to M6 included in component mounting lines L1 to L3, arrangement work support device 4, mobile terminal T used by worker W, and the like, and stores the information in storage unit 31 as feeder information 46. Component location information acquisition unit 35 acquires information on the location of component D to be mounted on the mounting substrate from electronic component mounting devices M3 to M6 included in component mounting lines L1 to L3, arrangement work support device 4, mobile terminal T used by worker W, and the like, and stores the information in storage unit 31 as component location information 47. Feeder information 46 and component location information 47 are updated every time the location of the feeder, an attachment state of component D, and the location of component D change due to the external setup work or the internal setup work.

Here, an example of feeder information 46 will be described with reference to FIG. 10. Feeder information 46 includes feeder number 69, feeder type 70, location 71, component attachment state 72, use schedule 73, and feeder capability 74. Feeder number 69 is information for specifying the feeder and is the same as feeder number 69 of component arrangement information 45. That is, feeder information 46 is associated with component arrangement information 45 via feeder number 69. Feeder type 70 indicates a type of the feeder, and "8 mm tape" indicates tape feeder 11 that conveys carrier tape 18 having a width of 8 mm, "double feeder" indicates double feeder 20, and "triple stick" indicates triple stick feeder 21.

Location 71 indicates a location of the feeder. For example, "C42/L1/#1R" indicates that the feeder is mounted on carriage 5 of which the carriage number mounted on component supply unit 10 on a rear side of electronic component mounting device M3(#1) of component mounting line L1 is "C42". Furthermore, "C73/preparation area" indicates that the feeder is mounted on carriage 5 with carriage number "C73" in preparation area As. In addition, "storage shelf/S05" indicates that the feeder is stored in a shelf of which shelf number 76 (see FIG. 11) of storage shelf 7 in preparation area As is "S05".

In FIG. 10, in component attachment state 72, information indicating whether or not component D (electronic component) is mounted on the feeder and, if mounted, specifying component D is stored. For example, "PR01(R214)" indicates that component D having component name 61 of "PR01" stored in reel 19 having reel number 75 (see FIG. 11) of "R214" is mounted on tape feeder 11 having feeder number 69 of "FT0802". Further, "PM55/PM09/PL06" indicates that three components D having component names 61 of "PM55", "PM09", and "PL06" are mounted on the triple stick feeder 21 having feeder number 69 of "FS111".

Furthermore, "-" indicates that component D is not mounted on the feeder. For example, tape feeder 11 with feeder number 69 of "FT0804" is stored in storage shelf 7 in a state where carrier tape 18 having component name 61 of "PC01" stored in reel 19 with reel number 75 of "R303" is mounted. Further, tape feeder 11 with feeder number 69 of "FT0805" is stored in storage shelf 7 in a state where carrier tape 18 is removed.

In FIG. 10, use schedule 73 is information on the use schedule of the feeder, and stores the type number of the mounting substrate when the next reservation is made, and stores "-" when the next reservation is not made. For example, tape feeder 11 with feeder number 69 of "FT0802" has a reservation for use in production of a mounting substrate with a type number of "B112" next.

Feeder capability 74 is information on the capability of the feeder, and in this example, accuracy 74a, speed 74b, and success rate 74c are displayed as S, A, B, and C. Accuracy 74a indicates a variation in the feed stop position when the feeder supplies component D to the component supply position. Speed 74b indicates an effective speed when the feeder supplies component D to the component supply position. Success rate 74c indicates a probability that component D supplied by the feeder can be sucked to suction nozzle 14b (probability that a suction error does not occur). In the feeder, a variation in a stop position increases, an effective speed decreases, or a suction error increases depending on a use frequency and an elapsed time from maintenance. Note that feeder capability 74 does not necessarily need to be displayed in sections such as S, A, B, and C, and may be a specific numerical value such as a variation, an effective speed, and a success rate.

As described above, feeder information 46 includes information on information on the feeder, such as information on the location of the feeder (location 71), information on the attachment state of the electronic component (component D) supplied by the feeder (component attachment information 62), and information on the use schedule of the feeder (use schedule 73). In addition, feeder information 46 includes information on the capability of the feeder, such as information on the feed stop position of the feeder (accuracy 74a), and information on whether the feeder is a multi-feeder that can supply a plurality of types of electronic components (feeder type 70).

Here, an example of component location information 47 will be described with reference to FIG. 11. Component location information 47 includes component name 61, reel number 75, feeder number 69, and shelf number 76. Component name 61 is the same as component name 61 of component information 44. Reel number 75 is information for specifying reel 19 storing component D having component name 61, and is the same as reel number 75 included in component attachment state 72 of feeder information 46. Component D with reel number 75 of "-" is stored in a unit other than reel 19, such as stick case 22. Note that, when a label having a stick case number stored therein is attached to stick case 22, the stick case number is stored in the column of reel number 75.

Feeder number 69 is the same as feeder number 69 of feeder information 46. Shelf number 76 is information for specifying a position of the shelf provided in storage shelf 7 in preparation area As, and is the same as shelf number 76 included in location 71 of feeder information 46. In this manner, component D in a state of being attached to the feeder is associated with feeder information 46 by feeder number 69, and the location of component D is identified by location 71 included in feeder information 46. In addition, the location of component D in a state of not being attached to the feeder is specified by shelf number 76.

In FIG. 7, production information acquisition unit 36 acquires (collects) information on the production of the workpiece (mounting substrate) from the various information stored in storage unit 31, and stores the information in storage unit 31 as production information 48. Specifically, production information acquisition unit 36 acquires, from production plan information 42, information on the priority of producing a type (hereinafter, the type is referred to as a "target type") of the mounting substrate to be produced in component mounting lines L1 to L3.

Production information acquisition unit 36 also acquires information on component size 63 of the electronic component (component D) mounted on the target type from type information 43 and component information 44. Furthermore, production information acquisition unit 36 acquires information on the number of uses of electronic components used for production of the target type from production plan information 42 and type information 43. Further, production information acquisition unit 36 acquires, from component arrangement information 45, information on component arrangement of electronic components used for production of the target type.

In FIG. 7, production history acquisition unit 37 acquires information on various errors occurring in the production of the mounting substrate in the production facility constituting component mounting lines L1 to L3, information on a correction value, and the like, and stores the information in storage unit 31 as production history information 49. Specifically, production history acquisition unit 37 acquires, from electronic component mounting devices M3 to M6, a suction error in which suction nozzle 14b cannot hold component D, a mounting error in which component D cannot be mounted on substrate B, a correction value of the mounting position when component D is mounted on substrate B, and the like. Maintenance information acquisition unit 38 acquires information on the state of tape feeder 11 from feeder maintenance device 6, and stores the information in storage unit 31 as maintenance information 50.

Based on production history information 49 and maintenance information 50 stored in storage unit 31, feeder evaluation unit 39 evaluates the capability of the feeder (feeder capability 74) including the variation in the feeding stop position of the feeder (accuracy 74a), the effective speed at which component D is supplied to the component supply position (speed 74b), and the success rate of component D normally sucked by the feeder (success rate 74c), and updates feeder capability 74 of feeder information 46. For example, feeder evaluation unit 39 determines feeder capability 74 from the frequency of the suction error, the magnitude of the correction value of the mounting position, the variation, the frequency of use of the feeder, the elapsed time from the maintenance, and the like.

In FIG. 7, target feeder determination unit 40 determines a feeder (hereinafter, the feeder is referred to as a "target feeder") to be used for production of a target type based on component arrangement information 45, feeder information 46, component location information 47, and production information 48, and determines an arrangement in component supply unit 10. When determining the target feeder and the arrangement thereof, target feeder determination unit 40 creates component arrangement information 45 for the setup change work obtained by updating (alternatively, newly designating) feeder number 69 in component arrangement information 45 of the target type, and stores the created component arrangement information in storage unit 31 as setup change component arrangement information 51.

FIG. 12 illustrates an example of setup change component arrangement information 51 created for performing the external setup work on carriage 5 of which the carriage number is "C73", and in addition to the information included in component arrangement information 45, reel number 75 of reel 19 for storing carrier tape 18 to be mounted on the feeder is also stored. Note that setup change component arrangement information 51 is created for each of component mounting lines L1 to L3 in addition to each of carriages 5.

Examples of the target feeder include a reuse feeder that mounts the feeder on which component D is mounted on carriage 5 as it is, and a newly mounted feeder that does not mount component D or removes mounted component D and newly mounts component D. When there is a usable reuse feeder, target feeder determination unit 40 preferentially allocates the reuse feeder to the target feeder.

When there is no feeder that satisfies required feeder capability 74 in the newly mounted feeder but is in the reusable feeder, target feeder determination unit 40 does not directly allocate the reusable feeder to the target feeder but allocates the same as the newly mounted feeder. That is, it is determined that mounted component D is removed from the reuse feeder, and component D is newly mounted as a newly mounted feeder and mounted on carriage 5. Hereinafter, a specific procedure for determining the target feeder will be described with reference to FIGS. 8 and 10 to 12, focusing on the determination of the newly mounted feeder by target feeder determination unit 40.

In FIG. 7, target feeder determination unit 40 includes first determination unit 40a and second determination unit 40b as internal processing units. First determination unit 40a determines a target feeder based on the information (location 71) on the location of the feeder included in feeder information 46. Specifically, when there is a plurality of candidate target feeders, first determination unit 40a preferentially selects a feeder close to a place where worker W performs work. For example, when external setup work is performed on carriage 5 connected to arrangement work support device 4, the priority of carriage 5 is high, and hereinafter, the priority of other carriages 5, storage shelf 7, and component mounting lines L1 to L3 in preparation area As is lowered in this order. As a result, the moving distance of worker W can be shortened.

Furthermore, first determination unit 40a determines the target feeder based on the information (component attachment state 72) on the attachment state of the electronic component (component D) included in feeder information 46. Specifically, first determination unit 40a sets the priority of the reuse feeder to be higher than that of the newly mounted feeder, and sets the priority of the feeder on which component D is not mounted to be higher than that of the feeder on which component D is mounted among the newly mounted feeders. Accordingly, it is possible to reduce the work of detaching unused component D from the feeder.

Further, first determination unit 40a determines the target feeder based on the information (use schedule 73) on the use schedule of the feeder included in feeder information 46. Specifically, first determination unit 40a excludes, from the target feeders, feeders scheduled to be used for other target types. As a result, it is possible to prevent the reserved feeder from being erroneously used for other production.

Component D with component name 61 of "PR01" supplied from a slot with slot number 67 of "1" in FIG. 12 is attached to tape feeder 11 with feeder number 69 of "FT0802" in FIG. 10. When tape feeder 11 is mounted as a reuse feeder in the slot of "1", work efficiency is good. However, since use of tape feeder 11 for production of a mounting substrate of which a compatible type is "B112" is input to use schedule 73, first determination unit 40a excludes the tape feeder from the target feeder.

In FIG. 7, when determining the target feeder, second determination unit 40b together determines target feeders of a plurality of target types including a target type scheduled to be produced next. That is, second determination unit 40b preferentially allocates the feeder having the capability suitable for the production of the target type to the production of the target type having the higher priority based on the information (feeder capability 74) on the capability of the feeder included in feeder information 46 and the information on the priority of producing the target type included in production information 48. For example, second determination unit 40b preferentially allocates a feeder having high feeder capability 74 such as speed 74b and success rate 74c to a target type having a high priority due to a small production time margin. As a result, the production capability of the target type having a high priority can be increased.

Furthermore, based on feeder capability 74 and the information on the number of uses of electronic components (components D) to be used for production of the target type included in production information 48, second determination unit 40b preferentially allocates the feeder having the capability suitable for mounting the electronic components used in large numbers to the electronic components used in large numbers. For example, second determination unit 40b preferentially allocates a feeder having high speed 74b to component D used in a large number. As a result, even when one feeder supplies component D to the plurality of suction nozzles 14b in the same mounting turn, it is possible to prevent an increase in mounting time by allocating a feeder having high speed 74b.

Further, based on feeder capability 74 and the information on component size 63 of the electronic component (component D) to be mounted in the target type included in production information 48, second determination unit 40b preferentially allocates a feeder having the capability suitable for mounting the electronic component having small component size 63 to the electronic component having small component size 63. For example, second determination unit 40b preferentially allocates a feeder having high accuracy 74a to component D having small component size 63. As a result, it is possible to suppress the occurrence of a suction mistake in which suction nozzle 14b cannot suck small component D.

Component D with component name 61 of "PR01" supplied from the slot with slot number 67 of "1" in FIG. 12 is minimum-sized component D with component size 63 of "0201" in FIG. 8. Therefore, second determination unit 40b allocates the feeder with accuracy 74a of "S" in FIG. 10 to component D. In the example of FIG. 10, accuracy 74a of the two feeders with feeder numbers 69 of "FT0802" and "FT0804" is "S". However, since "ST0802" includes use schedule 73, second determination unit 40b allocates "FT0804" to the slot of "1". Since "FT0804" is a newly mounted feeder, second determination unit 40b allocates component D whose reel number 75 is "R801".

In FIG. 7, second determination unit 40b preferentially allocates the plurality of feeders having a small difference in feeding stop positions to the plurality of electronic components that can be simultaneously sucked by the plurality of suction nozzles 14b that suck the electronic components, based on the information (accuracy 74a) on the feeding stop positions of the plurality of feeders and the information on the component arrangement of the electronic components (components D) to be used for production of the target type included in production information 48. As a result, when the plurality of suction nozzles 14b simultaneously suck components D, it is possible to suppress variation in the suction positions of components D and occurrence of a suction mistake.

In FIG. 12, components D supplied from the slots with slot numbers 67 of "6" to "9" are targets of simultaneous suction. Therefore, second determination unit 40b allocates feeders with accuracy 74a of "S" or "A" as the target feeders to be mounted in the slots of "6" to "9". In FIG. 10, feeder number 69 of "FT0803" is a reuse feeder on which component name 61 of "PR02" is mounted, and "FT0807" is a reuse feeder on which "PR52" is mounted, and both of accuracies 74a are "A". Therefore, second determination unit 40b allocates "FT0803" to the slot of "6" and "FT0807" to the slot of "7".

In FIG. 10, feeder number 69 "FT0805" indicates a newly mounted feeder on which component D is not mounted. However, since accuracy 74a is "B", second determination unit 40b excludes the newly mounted feeder from the target feeders for simultaneous suction. Then, second determination unit 40b allocates "FT0806" with accuracy 74a of "A" to the slot of "8" and "FT0808" to the slot of "9", respectively. In addition, since "FT0806" and "FT0808" are the newly mounted feeders, second determination unit 40b allocates component D with reel number 75 of "R222" and component D with "R662" in storage shelf 7, respectively.

In FIG. 7, second determination unit 40b preferentially allocates a multifeeder to the electronic component to which the multifeeder is applicable based on the information (feeder type 70) as to whether the multifeeder is a multifeeder that can supply a plurality of types of electronic components. In FIG. 12, since supply method 68 is "double feeder" for the slots with slot numbers 67 of "2L" and "2R", second determination unit 40b allocates double feeder 20 with feeder number 69 of "FD005" to the slots with "2L" and "2R". In the slots of "3" to "5", since supply method 68 is "stick", second determination unit 40b allocates triple stick feeder 21 with feeder number 69 of "FS111" to the slots of "3" to "5".

As described above, target feeder determination unit 40 (first determination unit 40a) determines the target feeder that is disposed in component supply unit 10 and is used to produce the target type, based on the information on the status of the feeder (feeder information 46). Accordingly, it is possible to support efficient work of the setup change of the feeder. Furthermore, target feeder determination unit 40 (second determination unit 40b) determines a target feeder that is disposed in component supply unit 10 and is used to produce a target type, based on the information on the capability of the feeder (feeder capability 74) and the information on the production of the workpiece (production information 48). As a result, it is possible to support the setup change of the feeder such that the work can be performed in consideration of the production plan, production efficiency, and quality of the mounting substrate to be manufactured.

In FIG. 7, pickup instruction unit 41 instructs to pick up the target feeder and component D (reel 19, stick case 22, and the like) based on the information (location 71) on the location of the feeder and shelf number 76. Furthermore, pickup instruction unit 41 issues an instruction including work related to removal of the electronic component from the target feeder or work related to attachment of the electronic component to the target feeder on the basis of the information (component attachment state 72) on the attachment state of the electronic component (component D). Pickup instruction unit 41 causes the display unit of mobile terminal T carried by worker W or arrangement work support device 4 to display the work instruction.

In addition, when instructing a robot to perform work, pickup instruction unit 41 transmits an instruction to the robot by radio or the like. At this time, when the robot picks up the target feeder, pickup instruction unit 41 instructs only the target feeder that can be picked up by the robot among the target feeders. For example, when the target feeder is at a position on a shelf of storage shelf 7 that cannot be picked up by the robot, the target feeder is excluded from the target to be picked up by the robot.

Figure 13:
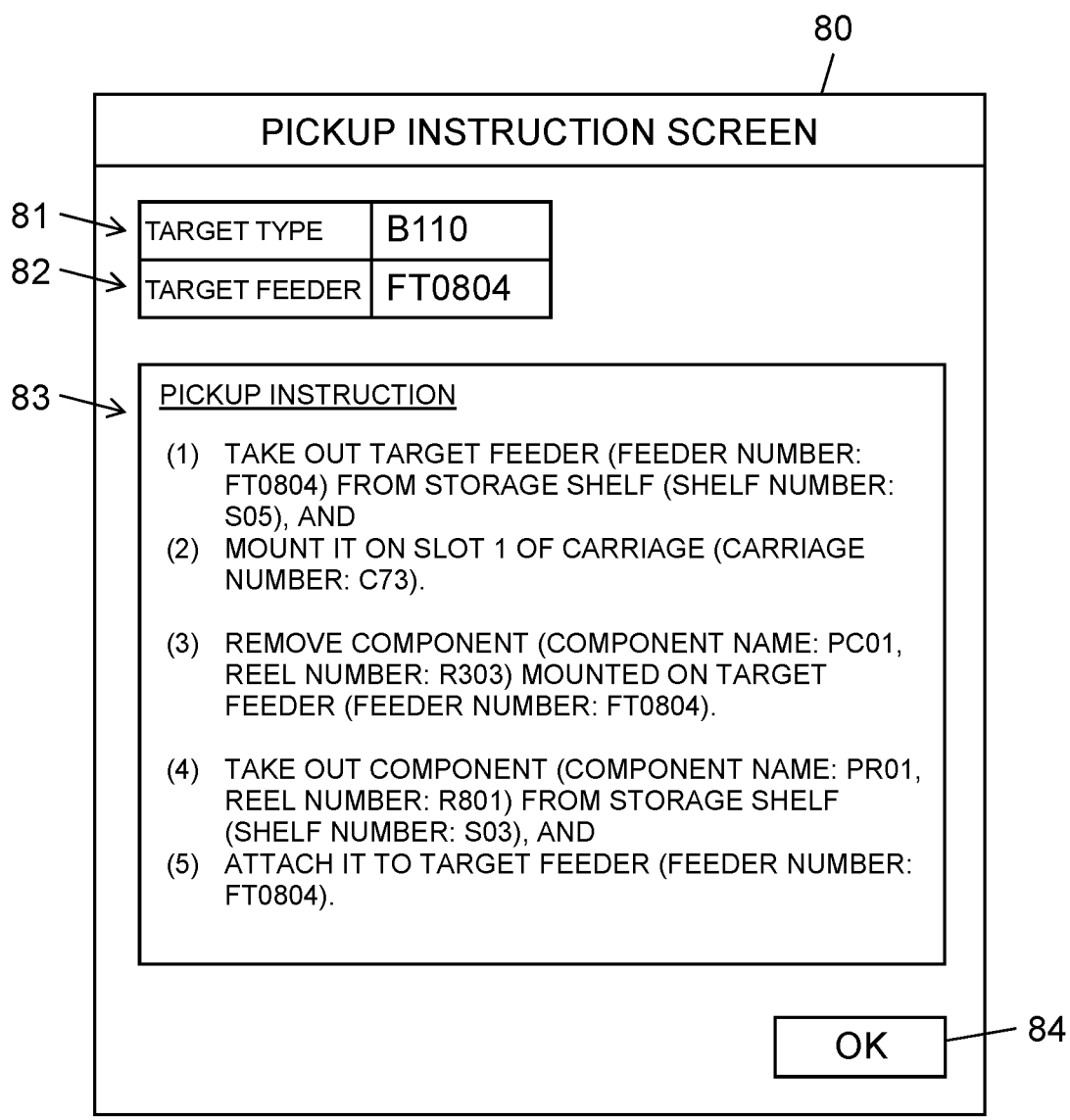
FIG. 13 is a view illustrating an example of a pickup instruction screen displayed on a touch panel of a mobile terminal included in the component mounting system of the exemplary embodiment.

Here, an example of pickup instruction screen 80 displayed on touch panel Tb of mobile terminal T by pickup instruction unit 41 will be described with reference to FIG. 13. FIG. 13 illustrates a pickup instruction of the target feeder (feeder number: FT0804) to be mounted on "1" with slot number 67 of setup change component arrangement information 51 illustrated in FIG. 12. On pickup instruction screen 80, "target type" display frame 81, "target feeder" display frame 82, "pickup instruction" display frame 83, and "OK" button 84 are displayed. In "target type" display frame 81, the type name (B110) of the mounting substrate as a setup change target is displayed. "Target feeder" display frame 82 displays feeder number 69 (FT0804) of the target feeder that is the target of the pickup instruction.

In "pick-up instruction" display frame 83, a pick-up instruction is displayed for each step. That is, in step (1), it is instructed to take out the target feeder (FT0804) from shelf number 76 of "S05" of storage shelf 7. In step (2), it is instructed to mount the target feeder (FT0804) in the slot with slot number 67 of "1" of carriage 5 with carriage number "C73". In step (3), it is instructed to remove component D (component name 61 is "PC01", and reel number 75 is "R303") currently mounted on target feeder (FT0804). That is, step (3) is an instruction of work related to removal of the electronic component (component D) from the target feeder.

In FIG. 13, in step (4), it is instructed to take out component D (component name 61 is "PR01", and reel number 75 is "R801") from shelf number 76 of "S03" of storage shelf 7. In step (5), it is instructed to attach component D taken out from storage shelf 7 to the target feeder (FT0804). That is, step (5) is an instruction of work related to attachment of the electronic component (component D) to the target feeder. When worker W operates "OK" button 84, a pickup instruction for the next target feeder is displayed.

As described above, management computer 3 including feeder information acquisition unit 34 that acquires the information on the status of the feeder (feeder information 46) and target feeder determination unit 40 (first determination unit 40a) that determines the target feeder based on the information on the status of the feeder is the setup change work support device. Accordingly, it is possible to support efficient work of the setup change of the feeder.

Management computer 3 includes feeder information acquisition unit 34 that acquires the information on the capability of the feeder (feeder information 46), production information acquisition unit 36 that acquires the information (production information 48) on the production of the workpiece (the mounting substrate), and target feeder determination unit 40 (first determination unit 40*a*) that determines the target feeder based on the information on the capability of the feeder and the information on the production of the workpiece. Management computer 3 is a setup change work support device. As a result, it is possible to support the setup change of the feeder such that the work can be performed in consideration of the production plan, production efficiency, and quality of the mounting substrate to be manufactured.

Figure 14:
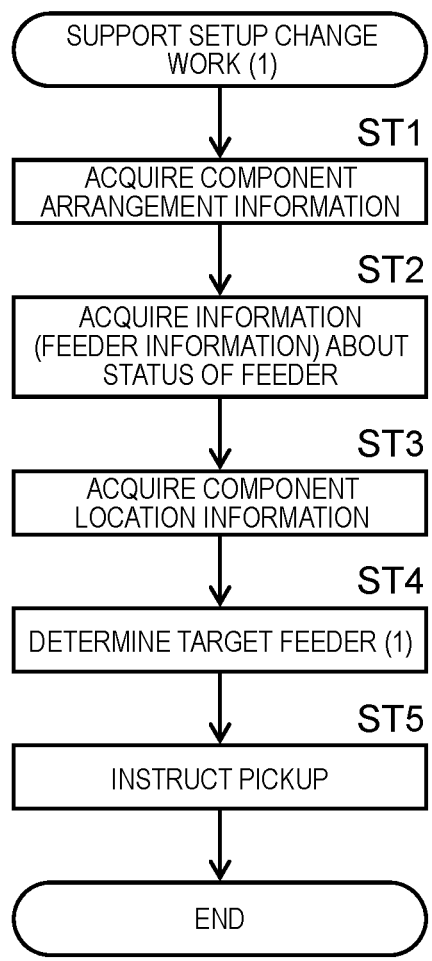
FIG. 14 is a flowchart of a first setup change work support method of the exemplary embodiment.

Next, a first setup change work support method of supporting the setup change by management computer 3 (setup change work support device) will be described along the flow of FIG. 14. First, processing unit 30 acquires component arrangement information 45 (ST1: component arrangement information acquisition step). Feeder information acquisition unit 34 then acquires information on the status of the feeder (feeder information 46) (ST2: first feeder information acquisition step). Next, component location information acquisition unit 35 acquires component location information 47 (ST3: component location information acquisition step).

Next, first determination unit 40*a* (target feeder determination unit 40) determines a target feeder to be used for production of the target type based on component arrangement information 45 and the information on the status of the feeder (feeder information 46) (ST4: first target feeder determination step). In the first target feeder determination step (ST4), the target feeder is determined based on the information on a location of the feeder (location 71), the information on an attachment state (component attachment state 72) of the electronic component (component D), and the information on the use schedule of the feeder (use schedule 73) included in feeder information 46. When the target feeder is determined, pickup instruction unit 41 instructs the pickup of the target feeder based on component location information 47 and the information on the location of the feeder (feeder information 46) (ST5: pickup instruction step).

In the pickup instruction step (ST5), when the robot picks up the target feeder, the robot is instructed to pick up only the target feeder that can be picked up among the target feeders. In the pickup instruction step, an instruction including work related to removal of the electronic component from the target feeder or work related to attachment of the electronic component to the target feeder is made based on the information on the attachment state (component attachment state 72) of the electronic component. Accordingly, it is possible to support efficient work of the setup change of the feeder.

Note that the timing at which the target feeder is determined (the timing at which the first setup change work support method is executed) may be immediately before worker W starts the setup change work of the target type, or may be when the manager determines a daily production plan. When the target feeder is determined based on the daily production plan, a plurality of pieces of setup change component arrangement information 51 corresponding to a plurality of target types to be produced on that day are created. When the setup change work is started based on setup change component arrangement information 51 created in advance, if there is a feeder or component D whose location is different from that of setup change component arrangement information 51, the first target feeder determination step (ST4) is executed again from the first feeder information acquisition step (ST2), and the setup change work is finally determined.

Figure 15:
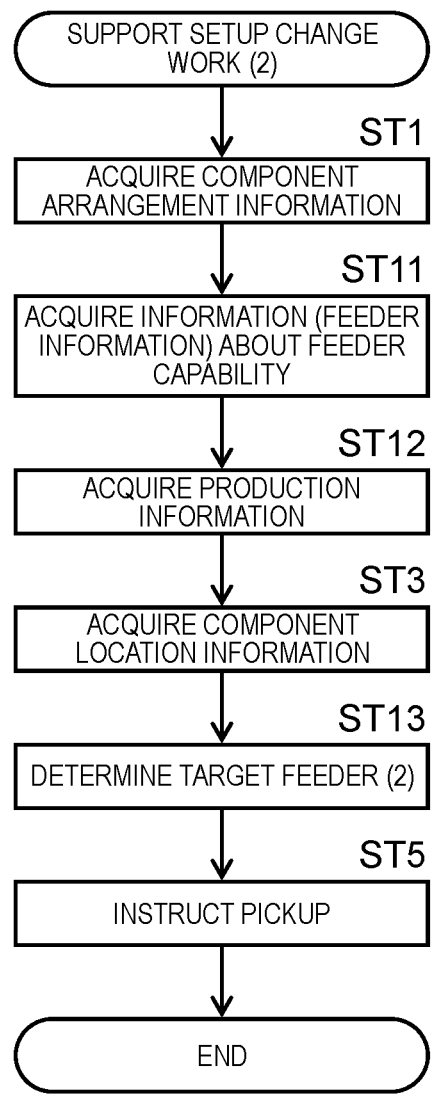
FIG. 15 is a flowchart of a second setup change work support method of the exemplary embodiment.

Next, a second setup change work support method of supporting a setup change by management computer 3 (setup change work support device) will be described along the flow of FIG. 15. The second setup change work support method is different from the first setup change work support method in that the target feeder is determined based on the information (feeder capability 74) on the capability of the feeder. Hereinafter, the same steps as those of the first setup change work support method are denoted by the same reference numerals, and a detailed description thereof will be omitted.

First, the component arrangement information acquisition step (ST1) is executed. Feeder information acquisition unit 34 then acquires information on the capability of the feeder (feeder information 46) (ST11: second feeder information acquisition step). Next, production information acquisition unit 36 acquires information (production information 48) on the production of the workpiece (mounting substrate) (ST12: production information acquisition step). Next, the component location information acquisition step (ST3) is executed. Next, second determination unit 40*b* (target feeder determination unit 40) determines the target feeder based on the information on the capability of the feeder (feeder capability 74 included in feeder information 46) and the information on the production of the workpiece (production information 48) (ST13: second target feeder determination step). Next, the pickup instruction step (ST5) is executed.

In the second target feeder determination step (ST13), the feeder having the capability suitable for the production of the target type is preferentially allocated to the production of the target type with high priority based on the information on the priority of producing the target type included in production information 48. In the second target feeder determination step (ST13), based on the information on component size 63 of the electronic component to be mounted in the target type included in production information 48, the feeder having the capability suitable for mounting the electronic component having small component size 63 is preferentially allocated to the electronic component having small component size 63. Furthermore, in the second target feeder determination step (ST13), based on the information on the number of uses of electronic components to be used for the production of the target type included in production information 48, a feeder having a capability suitable for mounting electronic components used in large numbers is preferentially allocated to electronic components used in large numbers.

In the second target feeder determination step (ST13), based on the information on the component arrangement of the electronic components to be used in the production of the target type included in production information 48 and the information on the feeding stop positions of the plurality of feeders included in feeder information 46 (feeder capability 74), the plurality of feeders having a small difference between the feeding stop positions are preferentially allocated to the plurality of electronic components that can be simultaneously sucked by the plurality of suction nozzles 14*b* that suck the electronic components. In the second target feeder determination step (ST13), a multifeeder is preferentially allocated to an electronic component to which the multifeeder is applicable based on the information (feeder type 70) on whether the multifeeder is a multifeeder (double feeder 20, triple stick feeder 21) that can supply a plurality of types of electronic components included in feeder information 46.

In the second target feeder determination step (ST13), target feeders of a plurality of target types including a target type scheduled to be produced next are determined together. In this way, it is possible to support the setup change of the feeder such that the work can be performed in consideration of the production plan, production efficiency, and quality of the mounting substrate to be manufactured.

In the above exemplary embodiment, feeder information 46 includes both the information on the status of the feeder (location 71, component attachment state 72, use schedule 73) and the information on the capability of the feeder (feeder capability 74), but the configuration of the file is not limited thereto. For example, the information on the status of the feeder and the information on the capability of the feeder may be set as individual files. Component information 44 may be coupled to feeder information 46. In addition, the format of the file stored in storage unit 31 can be changed as appropriate.

According to the present disclosure, it is possible to support the setup change of the feeder such that the work can be performed in consideration of the production plan, production efficiency, and quality of the mounting substrate to be manufactured.

INDUSTRIAL APPLICABILITY

The setup change work support method and the setup change work support device of the present disclosure have an effect of being able to support the work of the setup change of the feeder in consideration of the production plan, the production efficiency, and the quality of the mounting substrate to be manufactured, and are useful in the field of mounting the electronic component on the substrate.

REFERENCE MARKS IN THE DRAWINGS 1 component mounting system
2 communication network
3 management computer (setup change work support device)
4 arrangement work support device
4a reader
5 carriage
6 feeder maintenance device
7 storage shelf
8 base
9 substrate conveyance mechanism
10 component supply unit
11 tape feeder (feeder)
11a component supply position
12 axis table
13 beam
14 mounting head
14a nozzle unit
14b suction nozzle
15 mounting head moving mechanism
16 head camera
17 component recognition camera
18 carrier tape
18A carrier tape
18B carrier tape
19 reel
19A reel
19B reel
19a label
20 double feeder (feeder)
20a back surface
20b insertion port
20c insertion port
20d upper surface
20e component supply position
20f component supply position
21 triple stick feeder (feeder)
21a component supply position
21b component supply position
21c component supply position
21d component conveyance mechanism
21e component conveyance mechanism
21f component conveyance mechanism
22 stick case
22A stick case
22B stick case
22C stick case
30 processing unit
31 storage unit
32 input unit
33 display unit
34 feeder information acquisition unit
35 component location information acquisition unit
36 production information acquisition unit
37 production history acquisition unit
38 maintenance information acquisition unit
39 feeder evaluation unit
40 target feeder determination unit
40a determination unit
40b determination unit
41 pickup instruction unit
42 production plan information
43 type information
44 component information
45 component arrangement information
46 feeder information
47 component location information
48 production information
49 production history information
50 maintenance information
51 component arrangement information
61 component name
62 electrical characteristic
63 component size
64 supply unit
65 line name
66 supply position
68 supply method
70 feeder type
71 location
72 component attachment state
73 use schedule
74 feeder capability
74a accuracy
74b speed
74c success rate
76 shelf number
80 pickup instruction screen
81 display frame
82 display frame
83 display frame
84 button
D component (electronic component)
M1 substrate supply device
M2 screen printing device M3 to M6 electronic component mounting device
M7 reflow device
M8 substrate recovery device
Ta terminal-side communication unit
Tb touch panel
Tc camera

The invention claimed is:

1. A feeder setup change method comprising:
a feeder information acquisition step of acquiring information on a capability of each of feeders, the feeders each being disposable in an electronic component mounting device and being capable of supplying identical electronic components to be mounted on a substrate, the electronic component mounting device mounting the electronic components supplied by the feeders on workpieces;
a production information acquisition step of acquiring information on production of each of workpiece types of the workpieces; and
a target feeder determination step of determining, among the feeders for feeding the identical electronic components, a target feeder to be disposed in the electronic component mounting device and used for production of a target workpiece type among the workpiece types, in accordance with the information on the capability of each of the feeders and the information on the production of each of the workpiece types.

2. The feeder setup change method according to claim 1, wherein:
the information on the production of each of the workpiece types includes information on a priority of producing the workpiece type, and
the target feeder determination step preferentially allocates a feeder to a workpiece type having the priority that is higher, the feeder having a capability suitable for production of the workpiece type among the feeders.

3. The feeder setup change method according to claim 1, wherein:
the information on production of each of the workpiece types includes information on a component size of an electronic component mounted in the workpiece type, and
the target feeder determination step preferentially allocates a feeder to an electronic component having the component size that is smaller than electronic components allocated to other feeders, the feeder having a capability suitable for mounting an electronic component that the component size of which is smaller than the electronic components allocated to the other feeders among the feeders.

4. The feeder setup change method according to claim 1, wherein:
the information on the production of each of the workpiece types includes information on a number of uses of electronic components used for production of the workpiece type, and
the target feeder determination step preferentially allocates a feeder to an electronic component having a number of uses is larger than electronic components allocated to other feeders, the feeder having a capability suitable for mounting electronic components that the number of uses is larger than the electronic components allocated to the other feeders among the feeders.

5. The feeder setup change method according to claim 1, wherein:
the information on the capability of the feeder includes information on feeding stop positions of the feeders,
the information on the production of the workpiece includes information on a component arrangement of the electronic components used for the production of the workpiece type, and
the target feeder determination step preferentially allocates a plurality of feeders having a smaller difference between the feeding stop positions than other feeders among the feeders to a plurality of electronic components among the electronic components that can be simultaneously sucked by a plurality of suction nozzles that suck the electronic components.

6. The feeder setup change method according to claim 1, wherein:
the information on the capability of the feeder includes information on whether or not the feeder is a multifeeder capable of supplying a plurality of types of electronic components, and
the target feeder determination step preferentially allocates the multifeeder to an electronic component to which the multifeeder is applicable.

7. The feeder setup change method according to claim 1, wherein in the target feeder determination step, the target feeders of the workpiece types including a workpiece type scheduled to be produced next are determined together.

8. The feeder setup change method according to claim 1, wherein the feeder information acquisition step further includes a pickup instruction step of acquiring information on a location of the feeder, and instructing to pick up the target feeder based on the information on the location of the feeder.

9. The feeder setup change method according to claim 8, wherein when the target feeder is picked up by a robot, the pickup instruction step instructs pickup of only a target feeder that can be picked up by the robot among the target feeders.

10. A component mounting device comprising:
a processor configured to:
acquire information on a capability of each of feeders, the feeders each being disposable in an electronic component mounting device and being capable of supplying identical electronic components to be mounted on a substrate, the electronic component mounting device mounting the electronic components supplied by the feeders on workpieces;
acquire information on production of each of workpiece type of the workpieces; and
determine, among the feeders, a target feeder to be disposed in the electronic component mounting device and used for production of a target workpiece type among the workpiece types, in accordance with the information on the capability of each of the feeders and the information on the production of each of the workpiece types.

* * * * *